LIGHT-EMITTING SEMICONDUCTOR HAVING RELATIVELY HEAVY OUTER LAYERS FOR HEAT-SINKING

Filed Nov. 21, 1966

Inventor:
HERBERT NELSON
Arthur I. Spechler
Attorney

United States Patent Office 3,428,845

Patented Feb. 18, 1969

3,428,845

LIGHT-EMITTING SEMICONDUCTOR HAVING RELATIVELY HEAVY OUTER LAYERS FOR HEAT-SINKING

Herbert Nelson, Princeton, N.J., assignor to Radio Corporation of America, a corporation of Delaware Filed Nov. 21, 1966, Ser. No. 595,696

U.S. Cl. 313—108 8 Claims

Int. Cl. H01j *1/62*

ABSTRACT OF THE DISCLOSURE

A gallium arsenide laser diode is provided comprising first and second regions of mutually different conductivity types with a PN junction therebetween. A third semiconductor layer is disposed on all but a small area of the second layer. The third layer forms and ancillary PN junction with the second layer. A relatively massive electrode which acts as a heat sink is disposed on the third layer and the small exposed area of the second layer. The ancillary PN junction is reversed biased by a voltage applied to the electrode, while the first PN junction is forward biased. The lateral resistance of the second layer is relatively high, so that the reverse biased ancillary junction limits the current flow across the first PN junction to substantially the region underlying the small exposed area which is directly contacted by the electrode.

Figure 1:
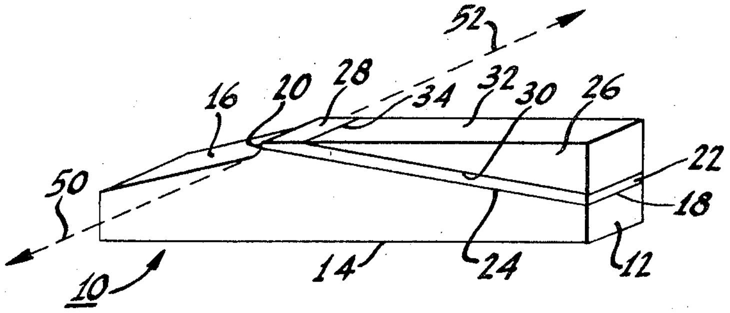

This invention relates generally to semiconductor structures, and more particularly to an improved, light-emitting, semiconductor device. The improved, light-emitting, semiconductor device is particularly useful for providing improved, laser structures of the GaAs (gallium arsenide) type.

The most common type of light-emitting, semiconductor devices of the prior art have been semiconductor diodes with parallelepiped structures. When these prior-art, light-emitting structures are manufactured for laser operation, their average dimensions are on the order of 10 mils long, 3 mils wide, and 4 mils high. Because of the high current density required to produce lasing at room temperature, the rate of heat generation within these tiny devices is enormous, especially when high peak currents are employed to secure several watts of laser light output.

It has been proposed to sandwich the aforementioned, parallelepiped, laser structure between two, large, metallic, heat sinks to dissipate the large quantity of heat generated. Such heat dissipating means, however, leave much to be desired because the contact areas between the heat sinks and diode are relatively very small and because soldered contacts between the heat sinks and the diode are very difficult, if not practically impossible, to effect. It has also been proposed to provide a laser diode in the form of a mesa structure to dissipate heat effectively, but a tiny mesa structure of suitable semiconductor material is relatively difficult to manufacture because of its fragility, and only a few such structures remain undamaged after packaging between heat sinks.

It is an object of the present invention to provide an improved, light-emitting, semiconductor device having improved heat removal means, improved series conductivity, and improved power handling capability.

Another object of the present invention is to provide an improved, light-emitting, semiconductor device whose structure is more rugged and whose contact surfaces are relatively much larger for making soldered connections thereto than those of the prior-art, parallelipiped structures.

Still another object of the present invention is to provide an improved, light-emitting, semiconductor device that is capable of lasing with a lower threshold current, at a given temperature, than the prior-art laser diodes.

A further object of the present invention is to provide an improved laser diode capable of operating CW (continuously) at a higher temperature than laser diodes of the prior art.

A still further object of the present invention is to provide an improved, light-emitting, semiconductor device capable of operating as an injection laser at room temperature with relatively longer duty cycle inputs and providing higher peak outputs than a laser diode of the same material in the form of the aforementioned parallelepiped structure.

Briefly stated, the improved, light-emitting, semi-conductor device comprises a three-layer structure. The second, or middle, layer is of an opposite type conductivity to that of its adjacent first and third layers and forms two PN junctions therewith. The third layer is on all but a relatively small area of the second layer, and a common electrical conductor is connected to both the third layer and at least a portion of the small area of the second layer. Thus, a voltage applied between the common electrical conductor and the first layer biases the two PN junctions in opposite directions with respect to each other for current flow. In operation, light is emitted from a relatively small portion of the forward biased PN junction, immediately adjacent to the portion of the common electrical conductor in contact with the second layer, when the applied voltage is of a predetermined amplitude.

Figure 2:
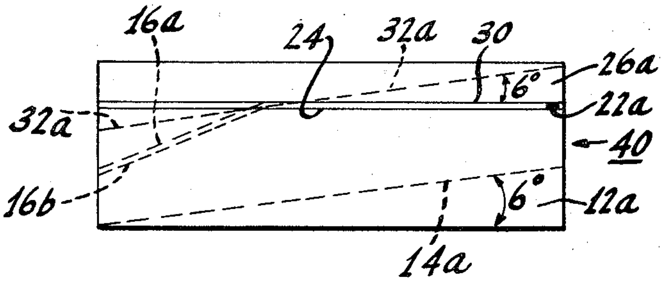
Figure 3:
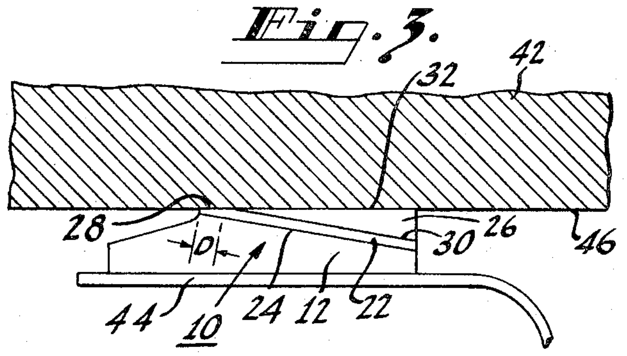

FIG. 1 is a perspective view of an improved, light-emitting, semiconductor device, FIG. 2 is a front, elevational view of a three-layered wafer of semiconductor material used to explain the preferred manufacture of the improved device shown in FIG. 1, and FIG. 3 is a front elevational view, somewhat reduced in size, of the improved, light-emitting device with electrical conductors connected thereto, one conductor which is also a heat sink being shown as a fragment in cross-section.

Referring now to FIG. 1 of the drawing, there is shown one embodiment of an improved, light-emitting, semiconductor device 10 suitable for use as a laser. The device 10 comprises a first layer 12 of semiconductor material of N type conductivity. The layer 12 may comprise, for example, N type GaAs having a donor charge carrier concentration of between about $2\times 10/\text{cm.}^3$ and $7\times 10^{18}/\text{cm.}^3$. The layer 12 has a rectangular bottom major surface 14 and an opposed major surface comprising two adjacent surface portions 16 and 18. The adjacent surface portions 16 and 18 form a dihedral angle, meeting in a common edge 20 and sloping therefrom towards the surface 14. The layer 12 may taper in thickness from about 2 to 10 mils.

A layer 22 of semiconductor material of P type conductivity, such as P type GaAs, for example, is deposited on the surface portion 18 of the layer 12 by any suitable means, as by either vapor phase or liquid phase epitaxial growth techniques well known in the art. The layer 22 forms a PN junction 24 with the layer 12. The layer 22 is between about 0.2 mil and 1.0 mil in thickness and has an acceptor charge carrier concentration of between about $2\times10^{19}/\text{cm.}^3$ and $4\times10^{19}/\text{cm.}^3$.

A wedge-shaped layer 26 of semiconductor material of N type conductivity, similar to that of the layer 12, is deposited on all but a relatively small surface portion 28 of the layer 22, as by any suitable epitaxial growth techniques known in the art. The layer 26 forms a PN junction 30 with the layer 22. The outer major surface 32 of the layer 26 forms an angle of between 2° and 10°, preferably 6°, with the PN junction 30 and is substantially parallel to the bottom major surface 14 of the layer 12. The surface 32 is also substantially coplanar with the surface portion 28 of the layer 22. The layer 22 is tapered in thickness at the surface portion 28 so that the surface portion 28 forms an obtuse dihedral angle with the PN junction 30. The wedge-shaped layer 26 has a sharp edge 34 that is substantially congruent with the common edge of the dihedral angle formed by the suface portion 28 and the PN junction 30. The layer 26, like the layer 12, is relatively much greater in bulk than the layer 22 and functions as a heat sink when the device 10 is operated as a light-emitting structure.

Referring now to FIG. 2 of the drawing, there is shown a front elevational view of a three-layered parallelepiped wafer 40 from which the device 10 can be manufactured. The wafer 40 comprises a layer **12*a* of semiconductor material of N type conductivity, a relatively much thinner layer 22*a* of P type conductivity on the layer 12*a*, and a layer 26*a* of semiconductor material of N type conductivity on the layer 22*a*. The layers 12*a*, 22*a*, and 26*a* of the wafer 40, shown in FIG. 2, are of the same material described for the layers 12, 22, and 26 of the device 10, shown in FIG. 1, and the layer 22*a* forms PN junctions 24 and 30 with the layers 12*a* and 26*a*, respectively. The overall dimension of the wafer 40 may be about 15 to 80 mils wide, 3 to 15 mils high, and any suitable length that makes the wafer 40** easy to handle.

The opposite major surfaces of the wafer 40 are lapped, holding the wafer 40 at an angle of between 2° and 10°, preferably 6°, to the lapping material, to the planes represented by the substantially parallel dashed lines **14*a* and 32*a*, providing the opposed parallel major surfaces 14 and 32 of the device 10, shown in FIG. 1. The planes represented by the dashed lines 14*a* and 32*a* are now metallized, by any suitable method to provide good ohmic contacts thereto, as by first coating them with nickel from an electroless nickel solution, and then coating the nickel with gold from an electroless gold solution. A portion of the upper surface of the layer 12*a* is then lapped further to the plane represented by the dashed line 16*a*, forming an obtuse dihedral angle with the PN junction 24. The latter lapped surface is now etched to a depth of about 0.2 mil by any suitable etchant to the plane represented by the dashed line 16*b*. The surface formed by the plane represented by the dashed line 16*b* is the surface portion 16 of the device 10. The surface formed by the plane represented by the dashed line 32*a* also includes the surface portion 28 of the layer 22 of the device 10. The thus lapped and etched wafer 40 is cleaved, if necessary, to provide the device 10 of desired cavity length (8 to 11 mils). A plurality of devices 10 can usually be prepared from a lapped and etched wafer 40**.

Referring now to FIG. 3 of the drawing, the device 10 is shown connected between a pair of electrical conductors 42 and 44. The conductor 42 is relatively much larger than the device 10 so that it may function as an effective heat sink to dissipate heat formed in the device 10 during its operation as a light-emitting device. The conductor 42 may comprise a block of molybdenum or copper having a planar surface 46 in electrical contact with both the planar surface 32 of the layer 26 and the planar surface portion 28 of the layer 22. Thus, the conductor 42 is a common electrical contact for both the layers 26 and 22. The conductor 44 may also be of molybdenum or copper and is in electrical contact with the major surface 14 of the layer 12.

The conductors 42 and 44 may make electrical contact with the device 10 either by pressure contacts or by soldered connections. The relatively larger surfaces of the device 10 contacted by the conductors 42 and 44 make the soldering of these conductors to the device 10 much easier than is possible to the relatively much smaller, prior-art, light-emitting diodes of the parallelepiped structure. The conductors 42 and 44 may be gold-plated to prevent their oxidation.

The operation of the device 10 as a light-emitting device will now be described. Let it be assumed that a voltage is applied between the conductors 42 and 44 of a polarity such that the PN junction 24 is forward biased to current flow and the PN junction 30 is reversed biased to current flow. Under these conditions, conventional current tends to flow from the conductor 42 to the conductor 44 through only the PN junction 24, the PN junction 30 being back biased. Since the layer 22 has a relatively high resistance and since the PN junction 30 is back biased, the greatest current density through the PN junction 24 is in the area of the PN junction 24 directly adjacent the portion 28 of the layer 22. If the amplitude of the applied voltage is such that the current density in a portion D (FIG. 3) of the PN junction 24, directly adjacent the portion 28 of the layer 22 (in contact with the conductor 42), is equal to or greater than a critical threshold value, for a given temperature, coherent light is emitted from the portion D of the PN junction 24 in the directions indicated by the dashed arrows 50 and 52, shown in FIG. 1. When the device 10 of GaAs material is operated as a laser, the coherent light emitted is in the infra-red spectrum, having a wave length of about 9000 A. The portion D of the PN junction 24 from which the light is emitted is shown as a width between dashed lines in FIG. 3. This width D is preferably between 0.7 and 1.5 mils. If the current density in the portion D of the PN junction 24 is less than the threshold value, for a given temperature, the light emitted will not be coherent, that is, it will be incoherent.

When the device 10 lases in the position indicated in FIG. 3, coherent light emerges from the portion D of the PN junction 24 perpendicularly to the sheet of the drawing. The presence of the N type layer 26 of relatively large bulk prevents direct current flow to most of the PN junction 24 from the overlying metal conductor 42 but serves to provide a high thermal conductivity for the heat developed in the lasing portion D of the PN junction 24. The relatively large bulk of the layer 12 of the device 10 also provides both high electrical and thermal conductivities as a consequence of its low spreading resistance.

Thus, there has been described an improved, light-emitting NPN structure with two relatively large, PN junctions. The effective width D of the lasing junction area may be reduced to one mil or less of the forward biased PN junction 24. Since electrical contact is made only to the portion D at the very end of the P type layer 22, this layer can be about 10 microns in thickness so as to provide a high resistance along its length and to restrict most of the current flow to the lasing area. The spreading resistance effect, provided by the N type layer 12, and the large surface contact areas of the layer 12 and 26, exposed to the conductors 42 and 44, provide the device 10 with a relatively low series resistance (about 0.25 ohm) and improved heat removal means from the lasing area. With a lasing junction area width of about 1 mil and a length of between about 8 and 11 mils, the device 10 of GaAs can be made to lase when the current through it is between 4 and 5 amperes at room temperature, the effective series resistance of the device 10 being between about 0.15 ohm and 0.35 ohm.

The light-emitting device 10 is superior to laser diodes of the prior-art, parallelelpiped type in power handling capability, especially under CW (continuous) operating conditions. For example, CW operation can be obtained for the improved device 10 up to temperatures of about 160° K., compared to about 100° K. for diodes of the conventional parallelepiped structure. At room temperature (300° K.), the improved device 10 can be operated at pulse repetition rates as high as 50 *kHz.* with pulse widths of 90 to 200 nanoseconds.

Generally, under CW operating conditions, the heat generated within a laser structure occurs largely as a result of the obsorption of photons throughout the bulk of the structure. In the prior-art, parallelepiped structures, the absorption occurs in an extremely small volume, and the heat generated is transferred to the heat sink through a relatively minute contact area. In the improved device 10, photon absorption occurs in a much larger volume, and the heat generated is transferred more effectively to the heat sink through a relatively much larger contact area.

It has been found that the rate of temperature rise is relatively smaller in the improved device 10 than in the prior-art, parallelepiped structure under comparable operating conditions. It has also been found that a single heat sink in contact with both the P type and N type layers of the device 10 is very effective for heat removal. Hence, since only one side of the device 10 need be soldered or brazed to one massive heat sink, mechanical strains that may otherwise be produced by an additional heat sink are avoided. Although only one side of the device 10 is in intimate contact with the heat sink, this contact area is relatively large and provdies effectively for the removal of heat from the N type side as well as from the P type side of the lasing area of PN junction.

What is claimed is:

1. A light emitting semiconductor device, comprising:

a first layer of semiconductor material of one type conductivity;

a second layer of semiconductor material of opposite type conductivity on said first layer and forming a first PN junction therewith;

a third layer of semiconductor material of said one type conductivity on substantially all but a small area of said second layer and forming a second PN junction therewith; and a relatively massive common electrical conductor of good thermal conductivity connecting at least a portion of said area and said third layer, so that a voltage applied between said conductor and said first layer forward biases said first PN junction and reverse biases said second PN junction, the lateral resistance of said second layer being sufficiently great so that current flow across said first PN junction is substantially confined to the portion of said first PN junction underlying said small area, the density of said current at said junction portion being sufficiently great, when a predetermined value of said voltage is applied, so that said junction portion emits optical radiation.

2. A semiconductor device as defined in claim 1 wherein the bulk of each of said first and third layers is greater than that of said second layer, whereby said first and third layers can function as heat sinks.

3. A semiconductor device as defined in claim 1 wherein said third layer has a planar surface, said portion has a planar surface in substantially the same plane as that of said planar surface of said third layer, and said conductor comprises a heat sink having a planar surface connected to said planar surfaces of said portion and said layer.

4. A light-emitting device comprising:

a first layer of semiconductor material of one type conductivity having first and second opposed major surfaces, said first major surface having first and second adjacent portions meeting in a first common edge and substantially defining an obtuse dihedral angle therebetween, said first and second portions sloping from said first common edge towards said second major surface, a second layer of semiconductor material of an opposite type conductivity having third and fourth opposed major surfaces, said third major surface being on said second portion and forming a first PN junction therewith, said fourth major surface having third and fourth adjacent portions meeting in a second common edge and substantially defining a second obtuse dihedral angle therebetween, said fourth portion being relatively much larger than said third portion, said third portion sloping from said second common edge towards said first PN junction, and a wedge-shaped third layer of said one type conductivity having fifth and sixth opposed major surfaces meeting in a sharply acute dihedral angle and having a third common edge, said fifth major surface being on said fourth portion and forming a second PN junction therewith, and said third common edge being congruent with said second common edge, said device benig adapted to emit light from a portion of said first PN junction adjacent to said third portion when said first PN junction is forward biased with a predetermined voltage.

5. A light-emitting device as defined in claim 4 wherein said third portion of said fourth surface and said sixth surface are substantial coplanar and a common electrical conductor is connected to both said third portion and said sixth surface, whereby said predetermined voltage causes a maximum current density through said portion of said first PN junction.

6. A light-emitting device as defined in claim 4 wherein said first layer comprises GaAs of N type conductivity having a donor charge carrier concentration of between about $2\times10^{18}/cm.^3$ and $7\times10^{18}/cm.^3$, said second layer comprises GaAs of P type conductivity having an acceptor charge carrier concentration of between about $2\times10^{19}/cm.^3$ and $4\times10^{19}/cm.^3$, and a substantially uniform thickness of between 0.2 and 1.0 mil, said wedge-shaped third layer comprises GaAs of N type conductivity having a charge carrier concentration substantially similar to that of said first layer, said sharply acute angle is about 6°, said third portion of said second layer is substantially a rectangular area having a width of about 1 mil and a length of about 10 mils, relatively large common electrical conductor is soldered to both said third portion and said sixth surface, and a conductor is soldered to said second surface.

7. A semiconductor device, comprising:

a first layer of semiconductor material of one type conductivity;

a second layer of semiconductor material of an opposite type conductivity on said first layer and forming a first PN junction therewith;

a third layer of semiconductor material of said one type conductivity on substantially all but a small area of said second layer and forming a second PN junction therewith, said third layer being wedge shaped and having a sharp edge, said second layer having an edge spaced from said sharp edge, at least a portion of said small area being between said edges, the bulk of said first and third layers being relatively much greater than that of said second layer, whereby said first and said third layers can function as heat sinks;

a common electrical conductor connected to both said portion and said third layer; and a conductor connected to said first layer, at least one of said conductors being a heat sink, whereby a voltage applied across said conductors biases said PN junctions in opposite directions for current flow.

8. A light emitting device according to claim 1, further comprising an optical cavity coupled to said junction portion, so that said optical radiation is coherent.

References Cited

UNITED STATES PATENTS

| | | | |
|---|---|---|---|
| 2,971,139 | 7/1961 | Noyce | 317—235 |
| 2,983,633 | 5/1961 | De Bernardi et al. | 148—1.5 |
| 3,283,207 | 11/1966 | Klein | 331—94.5 X |
| 3,316,464 | 4/1967 | Hilsum | 331—94.5 X |

ROBERT SEGAL, *Primary Examiner.*

R. F. HOSSFELD, *Assistant Examiner.*

U.S. Cl. X.R.

317—234, 235; 331—94.5